United States Patent
Nemoto et al.

(10) Patent No.: US 9,164,534 B2
(45) Date of Patent: Oct. 20, 2015

(54) CIRCUIT FOR SKEW REDUCTION HAS SWAP CIRCUIT SWAPPING AND CONNECTING FIRST SIGNAL LINES TO SECOND SIGNAL LINES

(71) Applicant: FUJITSU SEMICONDUCTOR LIMITED, Yokohama-shi, Kanagawa (JP)

(72) Inventors: Yutaka Nemoto, Akiruno (JP); Yoshimasa Ogawa, Kokubunji (JP)

(73) Assignee: SOCIONEXT INC., Yokohama (JP)

( * ) Notice: Subject to any disclaimer, the term of this patent is extended or adjusted under 35 U.S.C. 154(b) by 263 days.

(21) Appl. No.: 13/945,476

(22) Filed: Jul. 18, 2013

(65) Prior Publication Data

US 2014/0021998 A1    Jan. 23, 2014

(30) Foreign Application Priority Data

Jul. 19, 2012   (JP) .................................. 2012-160381

(51) Int. Cl.
*G06F 1/04* (2006.01)
*G06F 1/10* (2006.01)
*H03K 5/00* (2006.01)

(52) U.S. Cl.
CPC ... *G06F 1/10* (2013.01); *H03K 5/00* (2013.01)

(58) Field of Classification Search
CPC ........................................................ G06F 1/10
USPC .................................. 713/322, 503; 327/296
See application file for complete search history.

(56) References Cited

U.S. PATENT DOCUMENTS

| | | | | |
|---|---|---|---|---|
| 6,114,890 A | * | 9/2000 | Okajima et al. | 327/170 |
| 6,340,910 B1 | | 1/2002 | Saeki | |
| 6,417,713 B1 | * | 7/2002 | DeRyckere et al. | 327/271 |
| 6,898,742 B2 | * | 5/2005 | Koyanagi et al. | 714/700 |
| 6,937,681 B2 | * | 8/2005 | Watanabe | 375/371 |
| 6,959,396 B2 | * | 10/2005 | Chen et al. | 713/503 |
| 7,202,721 B2 | * | 4/2007 | Jeon | 327/158 |
| 7,272,742 B2 | * | 9/2007 | Schoenfeld et al. | 713/503 |
| 7,433,441 B2 | * | 10/2008 | Jenkins et al. | 375/371 |
| 7,609,695 B2 | * | 10/2009 | Zhu et al. | 370/392 |
| 7,765,425 B1 | * | 7/2010 | Searles et al. | 713/503 |
| 7,809,971 B2 | * | 10/2010 | Shimobeppu | 713/400 |
| 8,028,186 B2 | * | 9/2011 | Bennett | 713/503 |
| 8,046,729 B1 | * | 10/2011 | Fung et al. | 716/126 |

FOREIGN PATENT DOCUMENTS

| | | |
|---|---|---|
| JP | 04-291510 A | 10/1992 |
| JP | 2001-007686 A | 1/2001 |

* cited by examiner

*Primary Examiner* — Chun Cao
(74) *Attorney, Agent, or Firm* — Arent Fox LLP (57) ABSTRACT

A circuit for skew reduction, includes: first signal lines configured to transmit first signals delayed by first paths respectively; second signal lines configured to transmit second signals delayed by second paths respectively; and a first swap circuit, wherein the first swap circuit is configured to swap and connect the at least one of the first signal lines to the at least one of the second signal lines, when a mutual delay time difference of the second signals in a state where the at least one of the first signal lines is swapped and connected to the at least one of the second signal lines is smaller than a mutual delay time difference of the second signal lines in a state where the first signal lines is connected to the second signal lines without being swapped.

6 Claims, 11 Drawing Sheets

| NO SWITCHING | 2-SIGNAL SWITCHING | 3-SIGNAL SWITCHING | 4-SIGNAL SWITCHING |
|---|---|---|---|
| | SWITCHING OF A↔b | SWITCHING OF A→b,B→c,C→a | SWITCHING OF A→b,B→c,C→d, D→a |
| | SWITCHING OF A↔c | SWITCHING OF A→c,C→b,B→a | SWITCHING OF A→b,B→a,C→d, D→c (SWITCHING OF A↔b,C↔d) |
| | SWITCHING OF A↔d | SWITCHING OF B→c,C→d,D→b | SWITCHING OF A→b,B→d,C→a, D→c |
| | SWITCHING OF B↔c | SWITCHING OF B→d,C→b,D→c | SWITCHING OF A→c,B→d,C→a, D→b (SWITCHING OF A↔c,B↔d) |
| | SWITCHING OF B↔d | SWITCHING OF A→c,C→d,D→a | SWITCHING OF A→c,B→d,C→b, D→a |
| | SWITCHING OF C↔d | SWITCHING OF A→d,C→a,D→c | SWITCHING OF A→c,B→a,C→d, D→c |
| | | SWITCHING OF A→b,B→d,D→a | SWITCHING OF A→d,B→a,C→b, D→c |
| | | SWITCHING OF A→d,B→a,D→b | SWITCHING OF A→d,B→c,C→b, D→a (SWITCHING OF A↔d,B↔c) |
| | | | SWITCHING OF A→d,B→c,C→a, D→b |
| 1 PATTERN | 6 PATTERNS | 8 PATTERNS | 9 PATTERNS |

F I G. 10

F I G. 11

| NUMBER OF SWAP SWITCHING | CONTENT OF SWAP SWITCHING | RESULT OF CHECK OF PORTION EQUAL TO N-MULTIPLICATION PHASES | NUMBER OF SWAP SWITCHING | CONTENT OF SWAP SWITCHING | RESULT OF CHECK OF PORTION EQUAL TO N-MULTIPLICATION PHASES |
|---|---|---|---|---|---|
| 1 | NO SWITCHING | PORTION EQUAL TO 2 PHASES OK | 13 | SWITCHING OF A→d,C→a,D→c | PORTION EQUAL TO 4 PHASES OK |
| 2 | SWITCHING OF A↔b | PORTION EQUAL TO 4 PHASES OK | 14 | SWITCHING OF A→b,B→d,D→a | PORTION EQUAL TO 2 PHASES OK |
| 3 | SWITCHING OF A↔c | PORTION EQUAL TO 4 PHASES OK | 15 | SWITCHING OF A→d,B→a,D→b | PORTION EQUAL TO 4 PHASES OK |
| 4 | SWITCHING OF A↔d | PORTION EQUAL TO 2 PHASES OK | 16 | SWITCHING OF A→b,B→c,C→d, D→a | PORTION EQUAL TO 2 PHASES OK |
| 5 | SWITCHING OF B↔c | PORTION EQUAL TO 2 PHASES OK | 17 | SWITCHING OF A→b,B→a,C→d, D→c (SWITCHING OF A↔b,C↔d) | PORTION EQUAL TO 4 PHASES OK |
| 6 | SWITCHING OF B↔d | PORTION EQUAL TO 2 PHASES OK | 18 | SWITCHING OF A→b,B→d,C→a, D→c | PORTION EQUAL TO 4 PHASES OK |
| 7 | SWITCHING OF C↔d | PORTION EQUAL TO 2 PHASES OK | 19 | SWITCHING OF A→c,B→d,C→a, D→b (SWITCHING OF A↔c,B↔d) | PORTION EQUAL TO 4 PHASES OK |
| 8 | SWITCHING OF A→b,B→c,C→a | PORTION EQUAL TO 4 PHASES OK | 20 | SWITCHING OF A→c,B→d,C→d, D→c | PORTION EQUAL TO 2 PHASES OK |
| 9 | SWITCHING OF A→c,C→b,B→a | PORTION EQUAL TO 4 PHASES OK | 21 | SWITCHING OF A→c,B→a,C→d, D→c | PORTION EQUAL TO 4 PHASES OK |
| 10 | SWITCHING OF B→c,C→d,D→b | PORTION EQUAL TO 2 PHASES OK | 22 | SWITCHING OF A→d,B→a,C→b, D→c | PORTION EQUAL TO 4 PHASES OK |
| 11 | SWITCHING OF B→d,C→b,D→c | PORTION EQUAL TO 2 PHASES OK | 23 | SWITCHING OF A→d,B→c,C→b, D→a (SWITCHING OF A↔d,B↔c) | PORTION EQUAL TO 2 PHASES OK |
| 12 | SWITCHING OF A→c,C→d,D→a | PORTION EQUAL TO 2 PHASES OK | 24 | SWITCHING OF A→d,B→c,C→a, D→b | PORTION EQUAL TO 4 PHASES OK |

CIRCUIT FOR SKEW REDUCTION HAS SWAP CIRCUIT SWAPPING AND CONNECTING FIRST SIGNAL LINES TO SECOND SIGNAL LINES

CROSS-REFERENCE TO RELATED APPLICATION

This application is based upon and claims the benefit of priority of the prior Japanese Patent Application No. 2012-160381, filed on Jul. 19, 2012, the entire contents of which are incorporated herein by reference.

FIELD

The embodiment discussed herein is directed to a skew reduction circuit.

BACKGROUND

There is known a delay adjustment circuit in which an upper pass gate is able to output an output signal delaying from an input signal by a basic delay time and a lower pass gate is able to output delaying by a delay time made by adding a fraction of the basic delay time to the basic delay time (for example, see Patent Document 1). A selector selects either one of the upper and lower pass gates based on a digital control signal.

Further, there is known a clock signal control circuit which makes polyphase clock signals that have phase errors influence each other to average phase error components of the respective clock signals while maintaining phases of the respective clock signals (for example, see Patent Document 2).

[Patent Document 1] Japanese Laid-open Patent Publication No. 4-291510

[Patent Document 2] Japanese Laid-open Patent Publication No. 2001-7686

SUMMARY

A circuit for skew reduction, includes: a plurality of first signal lines configured to transmit a plurality of first signals delayed by a plurality of first paths respectively; a plurality of second signal lines configured to transmit a plurality of second signals delayed by a plurality of second paths respectively; and a first swap circuit configured to swap and connect at least one of the plurality of first signal lines to at least one of the plurality of second signal lines in correspondence with a first control signal, wherein the first swap circuit is configured to swap and connect the at least one of the plurality of first signal lines to the at least one of the plurality of second signal lines, when a mutual delay time difference of the plurality of second signals in a state where the at least one of the plurality of first signal lines is swapped and connected to the at least one of the plurality of second signal lines is smaller than a mutual delay time difference of the plurality of second signal lines in a state where the plurality of first signal lines is connected to the plurality of second signal lines without being swapped.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
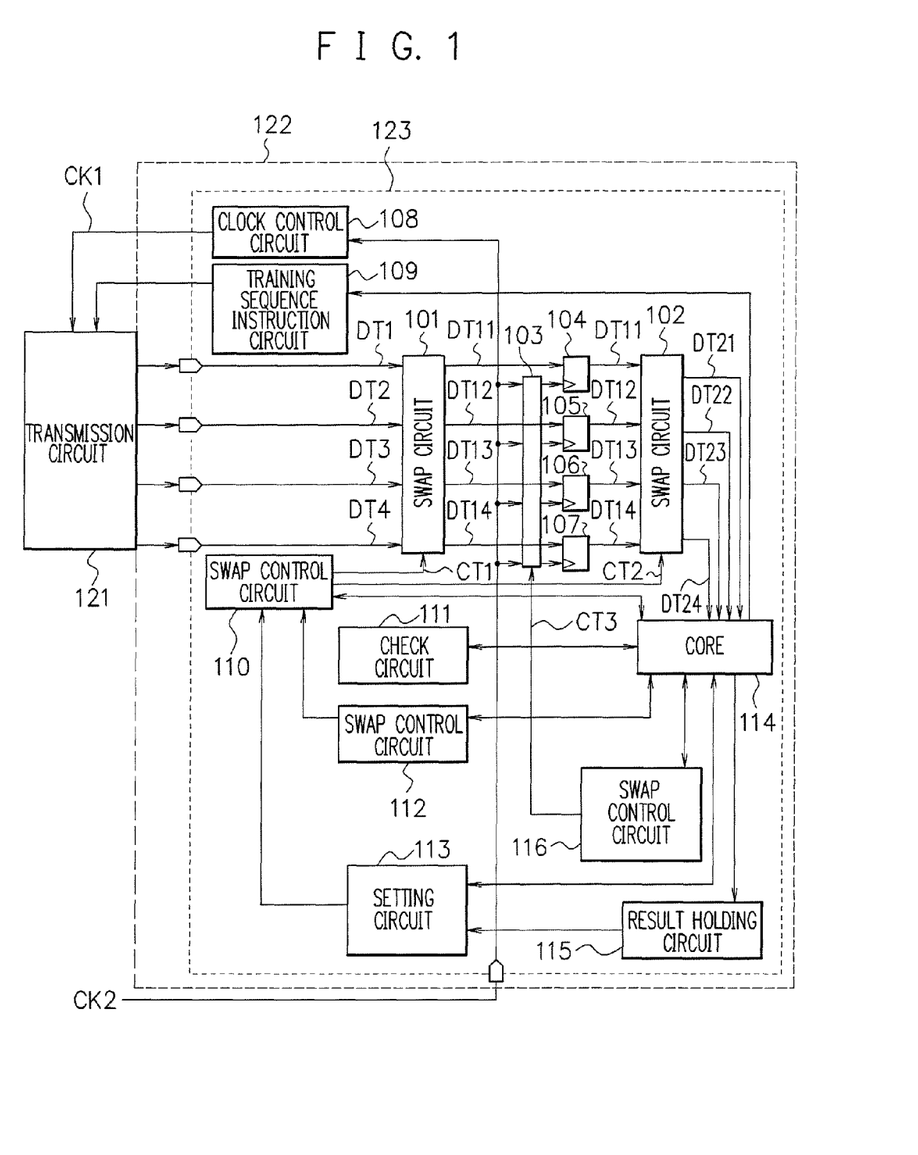
FIG. 1 is a diagram illustrating a configuration example of a skew reduction circuit according to an embodiment.
Figure 2:
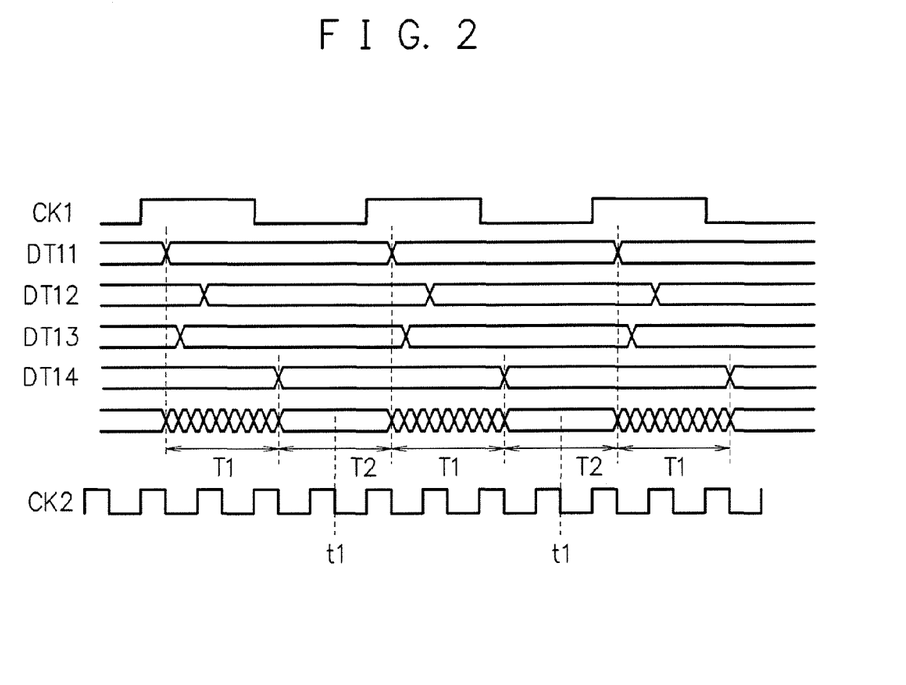
FIG. 2 is a timing cart illustrating an operation example of the skew reduction circuit of FIG. 1.

FIG. 1 is a diagram illustrating a configuration example of a skew reduction circuit according to an embodiment, and FIG. 2 is a timing chart illustrating an operation example of the skew reduction circuit of FIG. 1. The skew reduction circuit has a transmission circuit 121 and a printed circuit board 122. A reception circuit 123 is mounted on the printed circuit board 122. The reception circuit 123 is, for example, a large scale integration (LSI). The transmission circuit 121 is, for example, a memory card, and is connected to the printed circuit board 122 via a slot. A clock control circuit 108 frequency-divides a clock signal CK2 and outputs a clock signal CK1. For example, a frequency of the clock signal CK2 is four times as large as a frequency of the clock signal CK1.

The transmission circuit 121 outputs data signals DT1 to DT4 of 4 bits, for example, in synchronicity with the clock signal CK1. A first swap circuit 101 swaps a part or all of the 4-bit data signals DT1 to DT4 in correspondence with the first control signal CT1 and outputs 4-bit data signals DT11 to DT14. The 4-bit data signals DT11 to DT14 are inputted to input terminals of four flip-flop circuits 104 to 107, respectively. Further, a third swap circuit 103 swaps a part or all of four branch signals of the clock signal CK2 and outputs the four branch signals to clock terminals of the four flip-flop circuits 104 to 107 respectively, in correspondence with a control signal CT3.

First explained will be a case where the swap circuits 101 and 103 do not swap. In such a case, the data signal DT11 is the same as the data signal DT1, the data signal DT12 is the same as the data signal DT2, the data signal DT13 is the same as the data signal DT3, and the data signal DT14 is the same as the data signal DT4. It is preferable, under normal circumstances, the 4-bit data signals DT11 to DT14 are the same in terms of data transition timings. However, the 4-bit data signals DT11 to DT14 have different signal passing paths respectively and are delayed by respective signal passing paths. Delay times of those signal passing paths are different from each other. Thus, as illustrated in FIG. 2, deviations occur among data transition timings of the data signals DT11 to DT14. For example, data transits in order of the data signals DT11, DT13, DT12, DT14. The deviation of data transit timings is a skew. A skew reduction circuit can reduce skews.

Next, a place in which the skew occurs will be explained. A first skew occurs between the inside of the transmission circuit 121 and an output terminal of the transmission circuit 121. A second skew occurs in a substrate wiring between the output terminal of the transmission circuit 121 and of an input circuit the reception circuit (LSI) 123. A third skew occurs between the input terminal 123 to an input terminal of the flip-flop circuits 104 to 107.

In FIG. 2, a period T1 is a data invalid period which includes the data transition timings of the data signal DT11 to DT14, and is a period during which stable data cannot be obtained. A period T2 is a data valid period which does not include data transit timings of data signal DT11 to DT14. The flip-flop circuits 104 to 107 latch the data signals DT11 to DT14 respectively in synchronicity with an edge of the clock signal CK2 at a timing t1 near a center of the data valid period T2, and outputs the latched data signals DT11 to DT14. Thereby, the flip-flop circuits 104 to 107 are able to latch the stable data signals DT11 to DT14. Here, the data valid period T2 is required to be a period of a value equal to or more than a standard value. However, when a time difference of the skew is large, the data valid period T2 is short. Thus, in the present embodiment, a data valid period T2 is made longer than reducing skews.

Figure 3A:
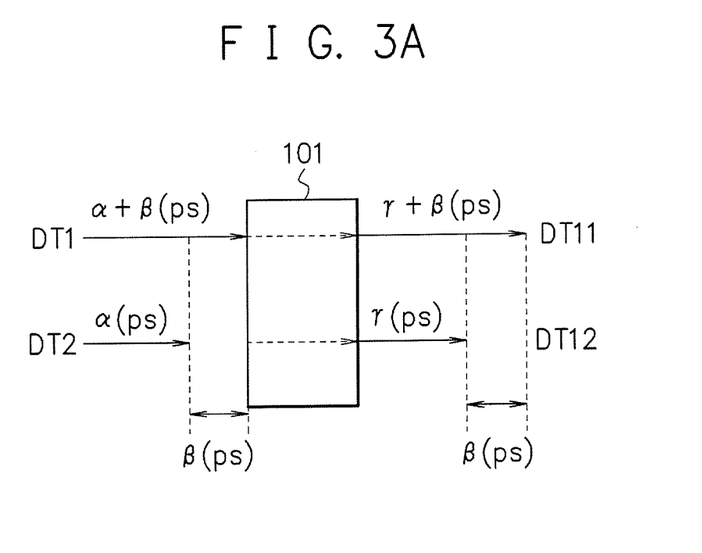
FIG. 3A is a diagram illustrating an example of a case where a first swap circuit of FIG. 1 does not swap and FIG. 3B is a diagram illustrating an example of a case where the first swap circuit of FIG. 1 swaps.

FIG. 3A is a diagram illustrating an example of a case where the first swap circuit 101 of FIG. 1 does not swap. The data signal DT1 has a delay time of, for example, α+β [ps] by the signal passing path, and the data signal DT2 has a delay time of, for example, α [ps] by the signal passing path. A mutual delay time difference of the data signals DT1 and DT2 is β [ps]. Those delay times are delay times by the signal passing paths between the transmission circuit 121 to the first swap circuit 101.

Further, the data signal DT11 has a delay time of, for example, γ+β [ps] by a signal passing path, and the data signal DT2 has a delay time of, for example, γ [ps] by a signal passing path. A mutual delay time difference of the data signals DT1 and DT2 is β [ps]. Those delay times are delay times by the signal passing paths between the first swap circuit 101 to the flip-flop circuits 104 to 107.

In such a case, the first swap circuit 101 connects a signal line of the data signal DT1 and a signal line of the data signal DT11, and connects a signal line of the data signal DT2 and a signal line of the data signal DT12. As a result, a total delay time of the data signal DT11 is, the delay time of α+β [ps] of the data signal DT1 and the delay time of γ+β [ps] of the data signal DT11 being added, α+γ+2×β [ps]. Further, a total delay time of the data signal DT12 is, the delay time of α [ps] of the data signal DT2 and the delay time of γ [ps] of the data signal DT12 being added, is α+γ [ps]. Hence a mutual delay time difference of the data signals DT11 and DT12 is 2×β [ps]. This is a case where the mutual delay time difference becomes largest.

Figure 3B:
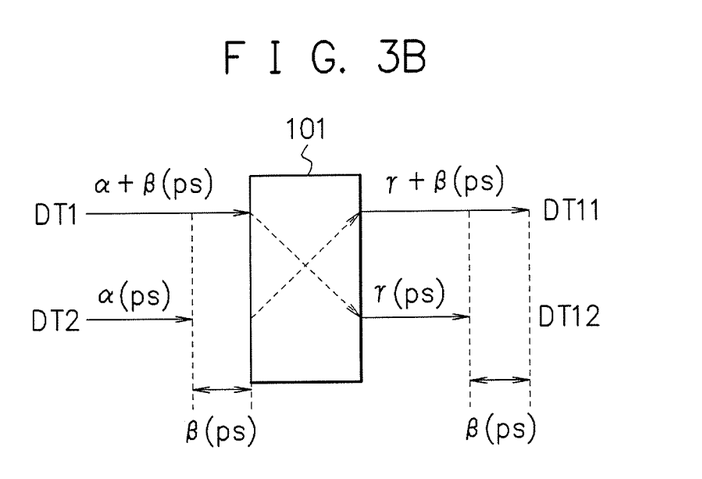

FIG. 3B is a diagram illustrating an example of a case where the swap circuit 101 of FIG. 1 swaps. Similarly to in FIG. 3A, a data signal DT1 has a delay time of α+β [ps], a data signal DT11 has a delay time of γ+β [ps], and a data signal DT12 has a delay time of γ [ps].

In such a case, the first swap circuit 101 connects a signal line of the data signal DT1 and a signal line of the data signal DT12, and connects a signal line of the data signal DT2 and a signal line of the data signal DT11. As a result, a total delay time of the data signal DT 11 is, the delay time of α [ps] of the data signal DT2 and the delay time of γ+β [ps] being added, α+β+γ [ps]. Further, a total delay time of the data signal DT12 is, the delay time of α+β [ps] of the data signal DT1 and the delay time of γ [ps] of the data signal DT12 being added, α+β+γ [ps]. Hence, a mutual delay time difference of the data signal DT11 and the DT12 is 0 [ps]. This is a case where the mutual delay time difference becomes smallest, and it is possible to shorten the mutual delay time difference by 2×β [ps] compared with the case of FIG. 3A.

The transmission circuit 121 of FIG. 1 is, for example, a memory card, and a variety of memory cards can be inserted into the slot of the printed circuit board 122. A timing chart of a time that a first memory card is used as the transmission circuit 121 is illustrated in FIG. 4A and a timing chart of a time that a second memory card is used as the transmission circuit 121 is illustrated in FIG. 4B.

Figure 4A:
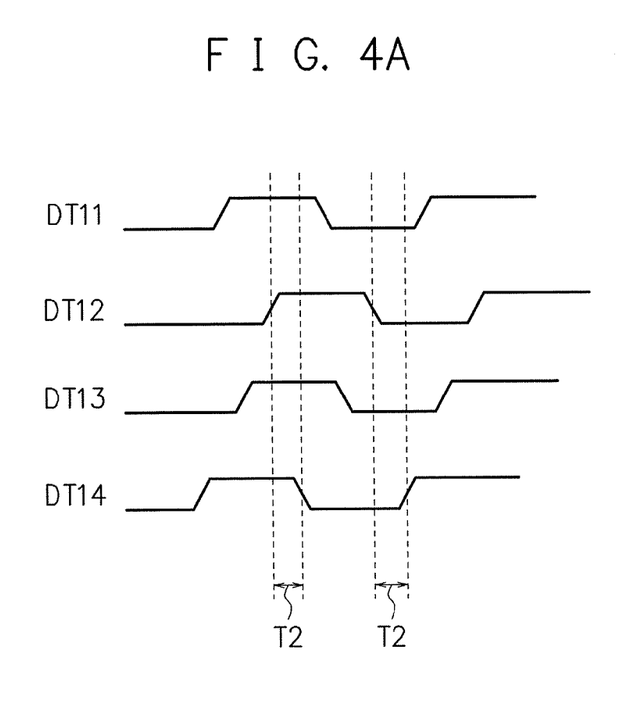
FIG. 4A is a timing chart of data signals at a time that a first memory card is used as a first transmission circuit of FIG. 1

FIG. 4A is the timing chart of data signals DT11 to DT14 at the time that the first memory card is used as the transmission circuit 121 of FIG. 1. Since the mutual delay time difference of the data signals DT11 to DT14 is comparatively large, the data valid period T2 is comparatively short.

Figure 4B:
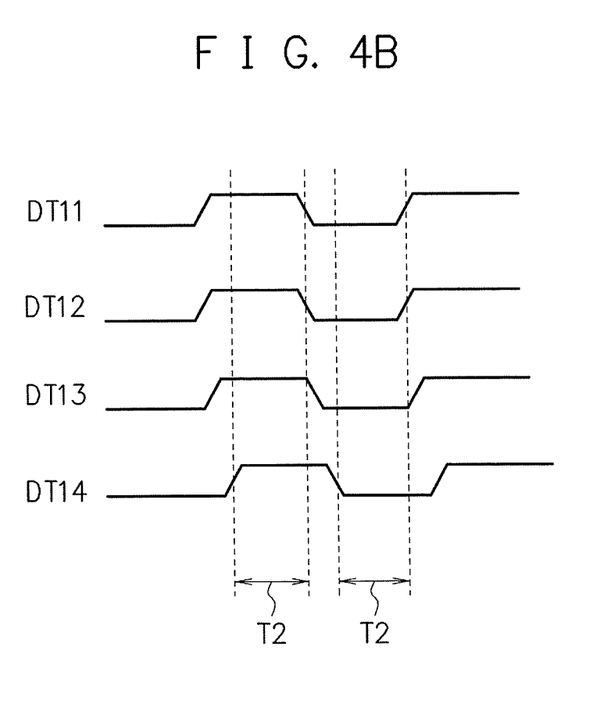
FIG. 4B is a timing chart of data signals at a time that a second memory card is used as the transmission circuit of FIG. 1.

FIG. 4B is the timing chart of data signals DT11 to DT14 at the time that the second memory card is used as the transmission circuit 121 of FIG. 1. Since the mutual delay time difference of the data signals DT11 to DT14 is comparatively small, the data valid period T2 is comparatively long.

As described above, the data valid period T2 differs per a kind of the memory card or per a product. However, it is necessary to adjust so that the data valid period T2 becomes equal to or more than a standard value no matter what memory card is used.

Figure 5:
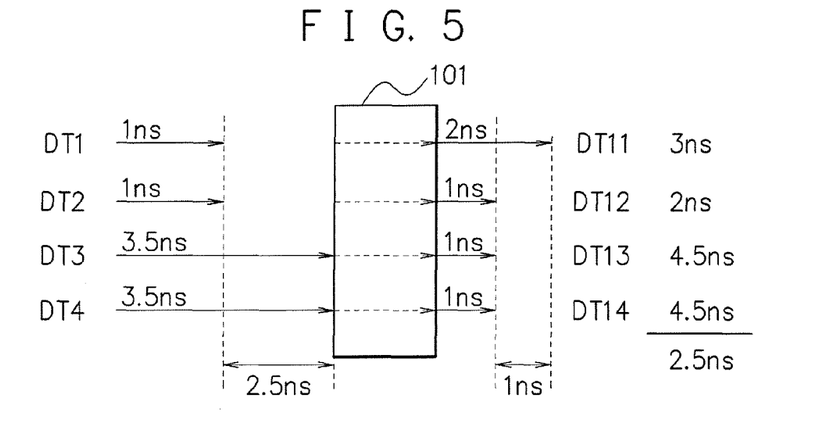
FIG. 5 is a timing chart of data signals at a time that a third memory card is used as the transmission circuit of FIG. 1.

FIG. 5 is a timing chart of data signals DT11 to DT14 at a time that a third memory card is used as the transmission circuit of 121 of FIG. 1. For example, a delay time of the data signal DT1 is 1 [ns], a delay time of the data signal DT2 is 1 [ns], a delay time of the data signal DT3 is 3.5 [ns], and a delay time of the data signal DT4 is 3.5 [ns]. The largest mutual delay time difference of the data signals DT1 to DT4 is 2.5 [ns]

Further, a delay time of the data signal DT11 is 2 [ns], a delay time of the data signal DT12 is 1 [ns], a delay time of the data signal DT13 is 1 [ns], and a delay time of the data signal DT14 is 1 [ns]. The largest mutual delay time difference of the data signals DT11 to DT14 is 1 [ns].

The first swap circuit 101 does not swap. In other words, the first swap circuit 101 connects a signal line of the data signal DT1 and a signal line of the data signal DT11, connects a signal line of the data signal DT2 and a signal line of the data signal DT12, connects a signal line of the data signal DT3 and a signal line of the data signal DT13, and connects a signal line of the data signal DT4 and a signal line of the data signal DT14.

As a result, a total delay time of the data signal DT11 is, the delay time of 1 [ns] of the data signal DT1 and the delay time of 2 [ns] of the data signal DT11 being added, 3 [ns]. Further, a total delay time of the data signal DT12 is, the delay time of 1 [ns] of the data signal DT2 and the delay time of 1 [ns] of the data signal DT12 being added, 2 [ns]. Further, a total delay tie of the data signal DT13 is, the delay time of 3.5 [ns] of the data signal DT3 and the delay time of 1 [ns] of the data signal DT13 being added, is 4.5 [ns]. Further, a total delay time of the data signal DT14 is, the delay time of 3.5 [ns] of the data signal DT4 and the delay time of 1 [ns] of the data signal DT4 being added, 4.5 [ns]. Thus, the largest mutual delay time difference of the data signals DT11 to DT14 is 4.5−2=2.5 [ns], which is 50% of a cycle (5 [ns]) of the clock signal CK1, and so a standard condition is satisfied. As described above, when the first swap circuit 10 satisfies the standard condition even if the first swap circuit 101 does not swap, it is not necessary for the first swap circuit 101 to swap.

Figure 6A:
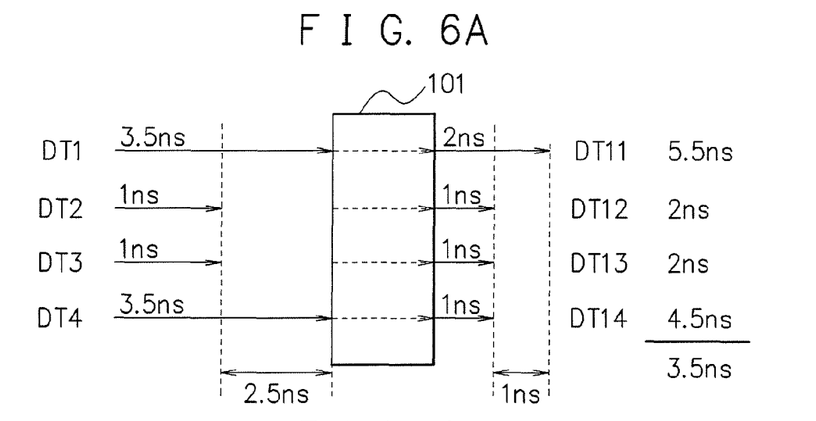
FIG. 6A and FIG. 6B are timing charts of data signals at a time that a fourth memory card is used as the transmission circuit.
Figure 6B:
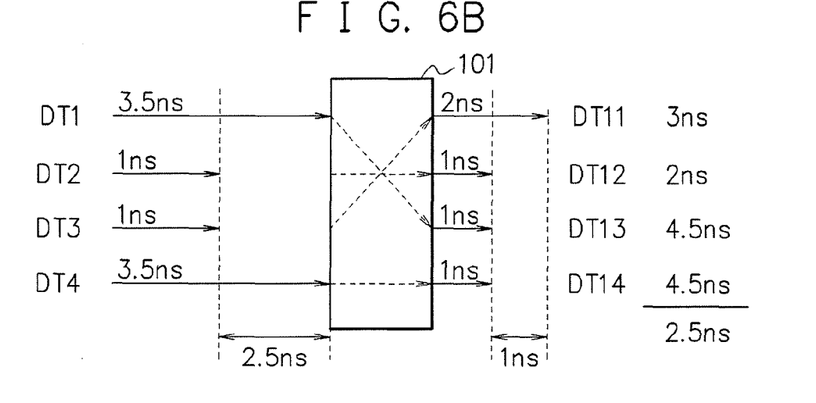

FIG. 6A and FIG. 6B are timing charts of data signals DT11 to DT14 at a time that a fourth memory card is used as the transmission circuit 121.

FIG. 6A is the timing chart at a time that the first swap circuit 101 does not swap. For example, a delay time of the data signal DT1 is 3.5 [ns], a delay time of the data signal DT2 is 1 [ns], a delay time of the data signal DT3 is 1 [ns], and a delay time of the data signal DT4 is 3.5 [ns]. The largest mutual delay time difference of the data signals DT1 to DT4 is 2.5 [ns], which is the same as in FIG. 5.

Further, a delay time of the data signal DT11 is 2 [ns], a delay time of the data signal DT12 is 1 [ns], a delay time of the data signal DT13 is 1 [ns], and a delay time of the data signal DT14 is 1 [ns]. The largest mutual delay time difference of the data signals DT11 to DT14 is 1 [ns], which is the same as in FIG. 5.

The first swap circuit 101 does not swap. In other words, the first swap circuit 101 connects a signal line of the data signal DT1 and a signal line of the data signal DT11, connects a signal line of the data signal DT2 and a signal line of the data signal DT12, connects a signal line of the data signal DT3 and a signal line of the data signal DT13, and connects a signal line of the data signal DT4 and a signal line of the data signal DT14.

As a result, a total delay time of the data signal DT11 is, the delay time of 3.5 [ns] of the data signal DT1 and the delay time of 2 [ns] of the data signal DT11 being added, 5.5 [ns]. Further, a total delay time of the data signal DT12 is, the delay time of 1 [ns] of the data signal DT2 and a delay time of 1 [ns] of the data signal DT12 being added, 2 [ns]. Further, a total delay time of the data signal DT13 is, the delay time of 1 [ns] of the data signal DT3 and the delay time of 1 [ns] of the data signal DT13 being added, 2 [ns]. Further, a total delay time of the data signal DT14 is, the delay time of 3.5 [ns] of the data signal DT4 and the delay time of 1 [ns] of the data signal DT14 being added, 4.5 [ns]. Hence, the largest mutual delay time difference of the data signals DT11 to DT14 is 5.5−2=3.5 [ns], which is 70% of the cycle (5 [ns]) of the clock signal CK1, and does not satisfy the standard condition.

As described above, in FIG. 5 and FIG. 6A, the largest mutual delay time differences (2.5 [ns]) of the data signals DT1 to DT4 and the largest mutual delay time differences (1 [ns]) of the data signals DT11 to DT14 are the same, but the standard condition is satisfied in the case of FIG. 5 while the standard condition is not satisfied in the case of FIG. 6A. Thus, in the case of FIG. 6A, it is necessary for the first swap circuit 101 to swap and reduce skews.

FIG. 6B is the timing chart at a time that the first swap circuit 101 swaps. Delay times of data signals DT1 to DT4 and DT11 and DT14 are the same as in FIG. 6A. The first swap circuit 101 swaps the data signal DT1 and the data signal DT3. In other words, the first swap circuit 101 connects a signal line of the data signal DT1 and a signal line of the data signal DT13, connects a signal line of the data signal DT2 and a signal line of the data signal DT12, connects a signal line of the data signal DT3 and a signal line of the data signal DT11, and connects a signal line of the data signal DT4 and a signal line of the data signal DT14.

As a result, a total delay time of the data signal DT11 is, the delay time of 1 [ns] of the data signal DT3 and the delay time of 2 [ns] of the data signal DT11 being added, 3 [ns]. Further, a total delay time of the data signal DT12 is, the delay time 1 [ns] of the data signal DT2 and the delay time of 1 [ns] of the data signal DT12 being added, 2 [ns]. Further, a total delay time of the data signal DT13 is, the delay time of 3.5 [ns] of the data signal DT1 and the delay time of 1 [ns] of the data signal DT13 being added, 4.5 [ns]. Further, a total delay time of the data signal DT14 is, the delay time of 3.5 [ns] of the data signal DT4 and the delay time of 1 [ns] of the data signal DT14 being added, 4.5 [ns]. Hence, the largest mutual delay time difference of the data signals DT11 to DT14 is 4.5−2=2.5 [ns], which is 50% of the cycle (5 [ns]) of the clock signal CK1, and satisfies the standard condition.

As described above, when the first swap circuit 101 does not swap and does not satisfy the standard condition as in FIG. 6A, by the first swap circuit 101 swapping as in FIG. 6B, the skews are reduced and the standard condition can be satisfied.

Figure 7:
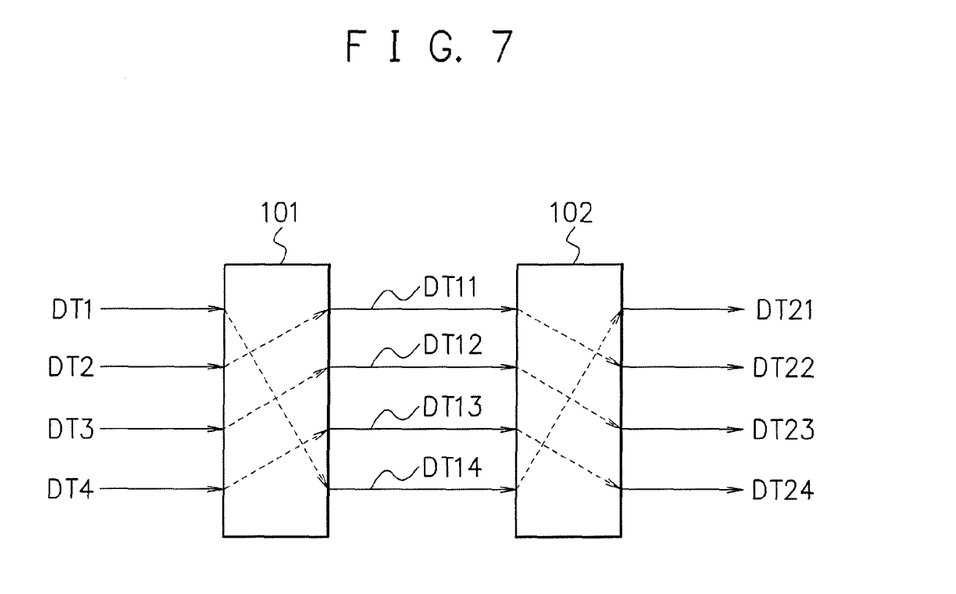
FIG. 7 is a diagram illustrating a configuration example of the first swap circuit and the second swap circuit of FIG. 1.

FIG. 7 is a diagram illustrating a configuration example of the first swap circuit 101 and the second swap circuit 102 of FIG. 1. When the above-described first swap circuit 101 swaps, order of bits of the data signals DT1 to DT4 differs from order of bits of the data signals DT11 to DT14. Thus, the order of bits is returned to original order by the second swap circuit 102 swapping the data signals DT11 to DT14.

The first swap circuit 101 connects a signal line of the data signal DT1 and a signal line of the data signal DT14, connects a signal line of the data signal DT2 and a signal line of the data signal DT11, connects a signal line of the data signal DT3 and a signal line of the data signal DT12, and connects a signal line of the data signal DT4 and a signal line of the data signal DT13. Thereby, similarly to in the case of FIG. 6B, it is possible to reduce skews. However, order of the bits of the data signals DT11 to DT14 becomes order of DT14, DT11, DT12, DT13, the order of the bits going wrong. Thus, the order of the bits is returned to the original order by the second swap circuit 102.

The second swap circuit 102 connects the signal line of the data signal DT11 and a signal line of a data signal DT22, connects the signal line of the data signal DT12 and a signal line of a data signal DT23, connects the signal line of the data signal DT13 to a signal line of a data signal DT24, and connects the signal line of the data signal DT14 and a signal line of a data signal DT21. Thereby, the data signal DT21 corresponds to the data signal DT1, the data signal DT22 corresponds to the data signal DT2, the data signal DT23 corresponds to the data signal DT3, and the data signal DT24 corresponds to the data signal DT4. Therefore, the order of bits of the data signals DT21 to DT24 becomes normal order of DT21, DT22, DT23, DT24.

As shown in FIG. 1, the third swap circuit 103, similarly to the first swap circuit 101, swaps and outputs branch signals of the clock signal CK2 to clock terminals of the flip-flop circuits 104 to 107, in correspondence with a third control signal CT3. Thereby, skews of the clock signal CK2 can be reduced.

In each of flip-flop circuits 104 to 107, the clock terminal is connected to an output terminal of the third swap circuit 103, an input terminal is connected to an output terminal of the first swap circuit 101, an output terminal is connected to an input terminal of the second swap circuit 102, respectively. In other words, in synchronicity with a rising edge and a falling edge of the clock signal CK2 outputted by the third swap circuit 103, the flip-flop circuits 104 to 107 latch the data signals DT11 to DT14 outputted by the first swap circuit 101 and outputs the latched data signals DT11 to DT14 to the second swap circuit 102, respectively.

A core 114 is a processor, which inputs the data signals DT21 to DT24 outputted by the second swap circuit 102 and acquires only the data signals DT21 to DT24 at a timing t1 of FIG. 2 as reception data, discarding the other data. Thereby, stable reception data can be received.

The reception circuit 123 has, in addition, swap control circuits 110, 112, 116, a check circuit 111, a setting circuit 113 and a result holding circuit 115. A first control signal CT1 and a second control signal CT2 are generated by the swap control circuit 110. The third control signal CT3 is generated by the swap control circuit 116.

Figure 8A:
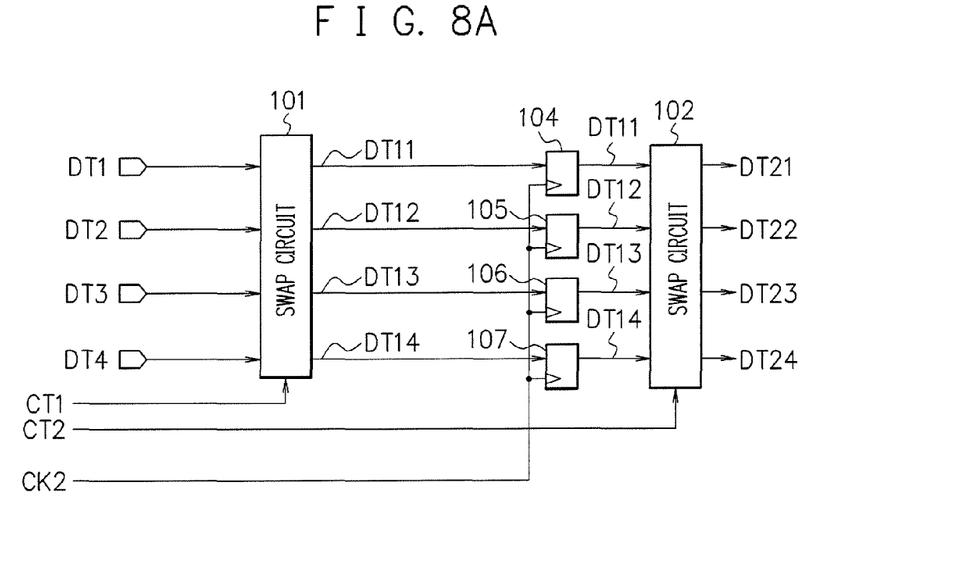
FIG. 8A and FIG. 8B are diagrams illustrating configuration examples of a part of a reception circuit according to another embodiment.

FIG. 8A is a diagram illustrating a configuration example of a part of a reception circuit 123 according to another embodiment. A circuit of FIG. 8A is a circuit in which a third swap circuit 103 is deleted in relation to the circuit of FIG. 1. In other words, a clock signal CK2 is directly inputted to clock terminals of flip-flop circuits 104 to 107. In a case where skews of the clock signal CK2 are not necessary to be reduced, the third swap circuit 103 of FIG. 1 is unnecessary. With regard to other points, the circuit of FIG. 8A is similar to the circuit of FIG. 1.

Figure 8B:
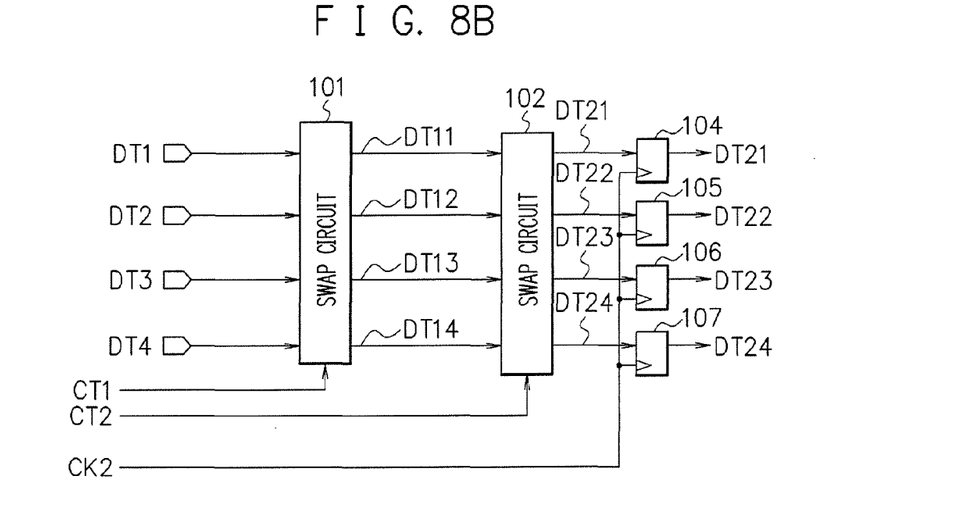

FIG. 8B is a diagram illustrating a configuration example of a part of a reception circuit 123 according to still another embodiment. A circuit of FIG. 8B is a circuit in which a position of a second swap circuit 102 is different in relation to the circuit of FIG. 8A. In the circuit of FIG. 8A, the second swap circuit 102 is positioned in a subsequent stage of the flip-flop circuits 104 to 107, while in the circuit of FIG. 8B the second swap circuit 102 is positioned in a previous stage of flip-flop circuits 104 to 107. In other words, the second swap circuit 102 inputs data signals DT11 to DT14 outputted by a first swap circuit 101 and outputs data signals DT21 to DT24. In the flip-flop circuits 104 to 107, respectively, a clock signal CK2 is inputted to clock terminals and the data signals DT21 to DT24 outputted by the second swap circuit 102 are inputted to input terminals. The circuit of FIG. 8B can also reduce skews similarly to in the circuit of FIG. 8A. Note that the second swap circuit 102 can be similarly provided in a previous stage of the flip-flop circuits 104 to 107 also in the circuit of FIG. 1.

Figure 9A:
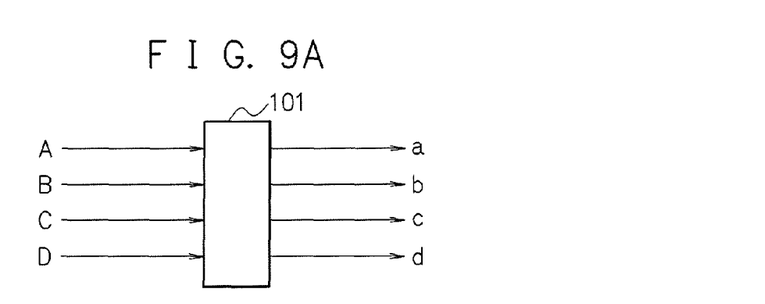
FIG. 9A and FIG. 9B are a diagram and a table for explaining all the patterns of a swapping method of the first swap circuit.
Figure 9B:
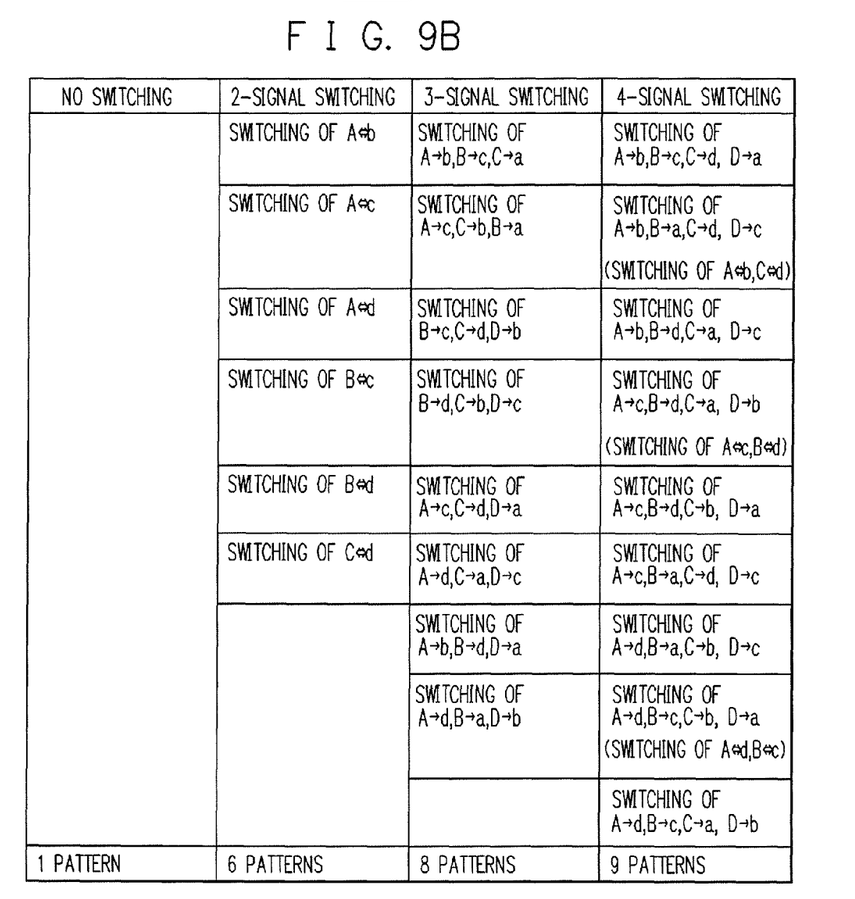

FIG. 9A and FIG. 9B are a diagram and a table for explaining all patterns of swapping methods of a first swap circuit 101. The first swap circuit 101 will be explained, for the sake of convenience of explanation, in an example of a case where 4-bit data signals A, B, C, D are inputted and 4-bit data signals a, b, c, d are outputted as illustrated in FIG. 9A. Though explanation is done in the case of 4-bit data signals, the same applies to a case of signals of other than 4 bits.

FIG. 9B is a table listing all the patterns of swapping methods of the first swap circuit 101 of FIG. 9A. First, the number of patterns in a case where the first swap circuit 101 does not perform switching of swap is one. In such a case, the first swap circuit 101 connects a line of the data signal A and a line of the data signal a, connects a line of the data signal B and a line of the data signal b, connects a line of the data signal C and a line of the data signal c, and connects a line of the data signal D and a line of the data signal d.

Next, there are six patterns of swapping methods in which the first swap circuit 101 switches two data signals. A first pattern is a pattern in which the first swap circuit 101 connects a line of the data signal A and a line of the data signal b, connects a line of the data signal B and a line of the data signal a, connects a line of the data signal C and a line of the data signal c, and connects a line of the data signal D and a line of the data signal d. A second pattern is a pattern in which the first swap circuit 101 connects a line of the data signal A and a line of the data signal c, connects a line of the data signal B and a line of the data signal b, connects a line of the data signal C and a line of the data signal a, and connects a line of the data signal D and a line of the data signal d. A third pattern is a pattern in which the first swap circuit 101 connects a line of the data signal A and a line of the data signal d, connects a line of the data signal B and a line of the data signal b, connects a line of the data signal C and a line of the data signal c, and connects a line of the data signal D and a line of the data signal a. A fourth pattern is a pattern in which the first swap circuit 101 connects a line of the data signal A and a line of the data signal a, connects a line of the data signal B and a line of the data signal c, connects a line of the data signal C and a line of the data signal b, and connects a line of the data signal D and a line of the data signal d. A fifth pattern is a pattern in which the first swap circuit 101 connects a line of the data signal A and a line of the data signal a, connects a line of the data signal B and a line of the data signal d, connects a line of the data signal C and a line of the data signal c, and connects a line of a data signal D and a line of the data signal b. A sixth pattern is a pattern in which the first swap circuit 101 connects a line of the data signal A and a line of the data signal a, connects a line of the data signal B and a line of the data signal b, connects a line of the data signal C and a line of the data signal d, and connects a line of the data signal D and a line of the data signal c.

Next, there are eight patterns of swapping methods in which the first swap circuit 101 switches three data signals. A first pattern is a pattern in which the first swap circuit 101 connects a line of the data signal A and a line of the data signal b, connects a line of the data signal B and a line of the data signal c, connects a line of the data signal C and a line of the data signal a, and connects a line of the data signal D and a line of the data signal d. A second pattern is a pattern in which the first swap circuit 101 connects a line of the data signal A and a line of the data signal c, connects a line of the data signal B and a line of the data signal a, connects a line of the data signal C and a line of the data signal b, and connects a line of the data signal D and a line of the data signal d. A third pattern is a pattern in which the first swap circuit 101 connects a line of the data signal A and a line of the data signal a, connects a line of the data signal B and a line of the data signal c, connects a line of the data signal C and a line of the data signal d, and connects a line of the data signal D and a line of the data signal b. A fourth pattern is a pattern in which the first swap circuit 101 connects a line of the data signal A and a line of the data signal a, connects a line of the data signal B and a line of the data signal d, connects a line of the data signal C and a line of the data signal b, and connects a line of the data signal D and a line of the data signal c. A fifth pattern is a pattern in which the first swap circuit 101 connects a line of the data signal A and a line of the data signal c, connects a line of the data signal B and a line of the data signal b, connects a line of the data signal C and a line of the data signal d, and connects a line of the data signal D and a line of the data signal a. A sixth pattern is a pattern in which the first swap circuit 101 connects a line of the data signal A and a line of the data signal d, connects a line of the data signal B and a line of the data signal b, connects a line of the data signal C and a line of the data signal a, and connects a line of the data signal D and a line of the data signal c. A seventh pattern is a pattern in which the first swap circuit 101 connects a line of the data signal A and a line of the data signal b, connects a line of the data signal B and a line of the data signal d, connects a line of the data signal C and a line of the data signal c, and connects a line of the data signal D and a line of the data signal a. An eighth pattern is a pattern in which the first swap circuit 101 connects a line of the data signal A and a line of the data signal d, connects a line of the data signal B and a line of the data signal a, connects a line of the data signal C and a line of the data signal c, and connects a line of the data signal D and a line of the data signal b.

Next, there are nine patterns of swapping methods in which the first swap circuit 101 switches four data signals. A first pattern is a pattern in which the first swap circuit 101 connects a line of the data signal A and a line of the data signal b, connects a line of the data signal B and a line of the data signal c, connects a line of the data signal C and a line of the data signal d, and connects a line of the data signal D and a line of the data signal a. A second pattern is a pattern in which the first swap circuit 101 connects a line of the data signal A and a line of the data signal b, connects a line of the data signal B and a line of the data signal a, connects a line of the data signal C and a line of the data signal d, and connects a line of the data signal D and a line of the data signal c. A third pattern is a pattern in which the first swap circuit 101 connects a line of the data signal A and a line of the data signal b, connects a line of the data signal B and a line of the data signal d, connects a line of the data signal C and a line of the data signal a, and connects a line of the data signal D and a line of the data signal c. A fourth pattern is a pattern in which the first swap circuit 101 connects a line of the data signal A and a line of the data signal c, connects a line of the data signal B and a line of the data signal d, connects a line of the data signal C and a line of the data signal a, and connects a line of the data signal D and a line of the data signal b. A fifth pattern is a pattern in which the first swap circuit 101 connects a line of the data signal A and a line of the data signal c, connects a line of the data signal B and a line of the data signal d, connects a line of the data signal C and a line of the data signal b, and connects a line of the data signal D and a line of the data signal a. A sixth pattern is a pattern in which the first swap circuit 101 connects a line of the data signal A and a line of the data signal c, connects a line of the data signal B and a line of the data signal a, connects a line of the data signal C and a line of the data signal d, and connects a line of the data signal D and a line of the data signal c. A seventh pattern is a pattern in which the first swap circuit 101 connects a line of the data signal A and a line of the data signal d, connects a line of the data signal B and a line of the data signal a, connects a line of the data signal C and a line of the data signal b, and connects a line of the data signal D and a line of the data signal c. An eighth pattern is a pattern in which the first swap circuit 101 connects a line of the data signal A and a line of the data signal d, connects a line of the data signal B and a line of the data signal c, connects a line of the data signal C and a line of the data signal b, and connects a line of the data signal D and a line of the data signal a. A ninth pattern is a pattern in which the first swap circuit 101 connects a line of the data signal A and a line of the data signal d, connects a line of the data signal B and a line of the data signal c, connects a line of the data signal C and a line of the data signal a, and connects a line of the data signal D and a line of the data signal b.

As described above, the number of the switching patterns of swap of the first swap circuit 101 is 1+6+8+9=24 in total. Then, the first swap circuit 101 performs swap of the above-described 24 switching patterns, and selects the switching pattern whose data valid period T2 is the longest thereamong. Thereby, skews can be reduced. A third swap circuit 103 is similar to the first swap circuit 101. A second swap circuit 102 performs swap to return order of bits to original order, in correspondence with swap of the first swap circuit 101.

Figure 10:
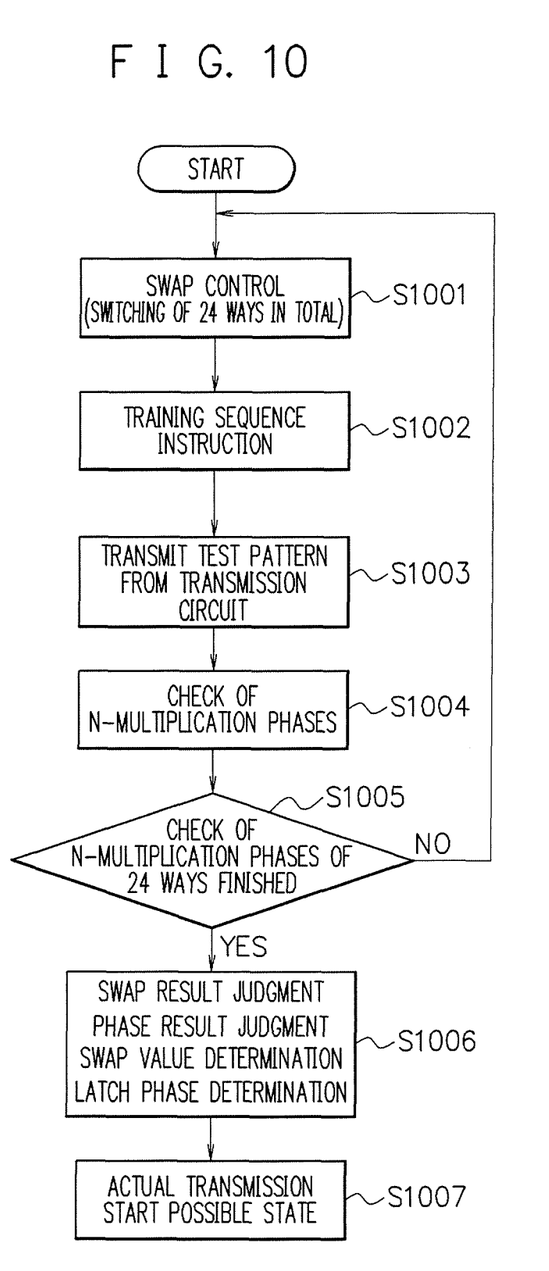
FIG. 10 is a flowchart illustrating a processing example of the skew reduction circuit of FIG. 1.

FIG. 10 is a flowchart illustrating a processing example of the skew reduction circuit of FIG. 1. First, in a step S1001, the swap control circuit 112 instructs the swap control circuit 110 to perform 24 switching patterns of FIG. 9B in order, by control of the core 114. For example, the swap control circuit 112 instructs the swap control circuit 110 to perform switching in order of 24 ways listed in FIG. 11. For example, in a first round, the swap control circuit 110 outputs first control signals CT1 and CT2 of no switching.

Next, in a step S1002, a training sequence instruction circuit 109 instructs the transmission circuit 121 to start a training sequence, by control of the core 114.

Next, in a step S1003, the transmission circuit 121 outputs data signals DT1 to DT4 of test patterns of 64 cycles, for example.

Next, in a step S1004, the flip-flop circuits 104 to 107 latch data signals DT11 to DT14 in synchronicity with a rising edge and a falling edge of a clock signal CK2, and outputs the latched data signals DT11 to DT14. Here, the clock signal CK2 is an N-multiplication signal of a clock signal CK1. For example, in a case of FIG. 12, N is "4". Thereby, the core 114 acquires eight pieces of sampling data per one cycle (5 [ns]) of the clock signal CK1. The check circuit 111 checks whether or not each piece of the sampling data coincides with an expected value of the test pattern, by control of the core 114. If the piece of sampling data coincides with all the expected values, that piece of sampling data can be judged to be data of the data valid period T2, and if not, that piece of sampling data can be judged to be data of the data invalid period T1. Thereby, the core 114 detects a length of the data valid period T2 and records in the result holding circuit 115.

Next, in a step S1005, the core 114 checks whether or not processings of all the 24 patterns are finished. If not finished, the process returns to the step S1001 and the processing of the next pattern is repeated. If finished, the process proceeds to a step S1006.

Next, in a step S1006, the core 114 compares the lengths of the data valid periods T2 of 24 patterns held in the result holding circuit 115, and instructs the setting circuit 113 to set the pattern with the longest data valid period T2. The swap control circuit 110 outputs a first control signal CT1 and a second control signal CT2 of the pattern with the longest data valid period T2, in correspondence with a setting instruction of the setting circuit 113.

Figure 11:
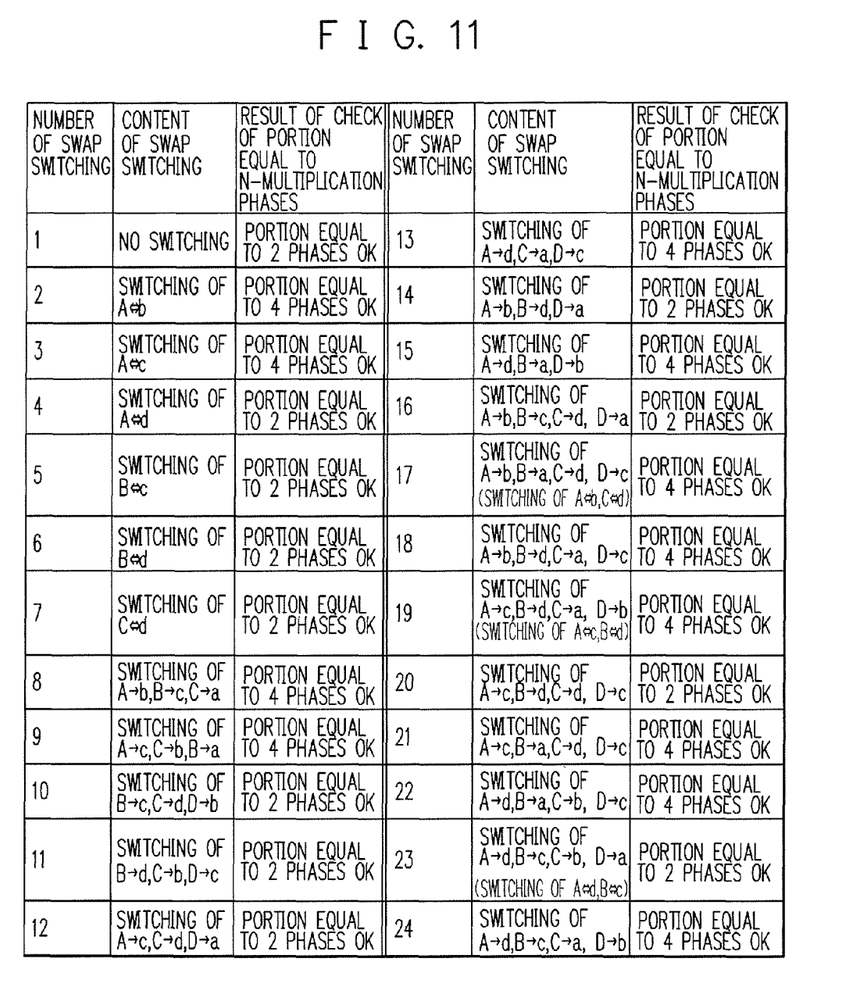
FIG. 11 is a table listing an example of lengths of data valid periods of 24 patterns held by a result holding circuit.

FIG. 11 is a table listing an example of lengths of the data valid periods T2 of 24 patterns held in the result holding circuit 115, and exhibits a result of a case of the delay time of FIG. 6B. A result of check of a portion equal to an N-multiplication phases indicates a length of the data valid period T2, and in a case of FIG. 12, where four edge phases P1 to P4 of the clock signal CK2 exist within the data valid period T2, the checked result is "portion equal to 4 phases OK". In a case of FIG. 11, the pattern of "portion equal to 4 phases OK" is the longest pattern of the data valid period T2. When there is a plurality of patterns of "portion equal to 4 phases OK", any pattern thereamong can be selected and set. For example, verification is started from a first round and if the pattern with the largest OK phase number exists in a stage later than the present result, the pattern of the ultimately largest OK phase number and that OK phase number are updated and selected each time. When the plural "portion equal to 4 phases OK" patterns exist, the pattern of a second round whose order is earliest among the patterns is selected.

Figure 12:
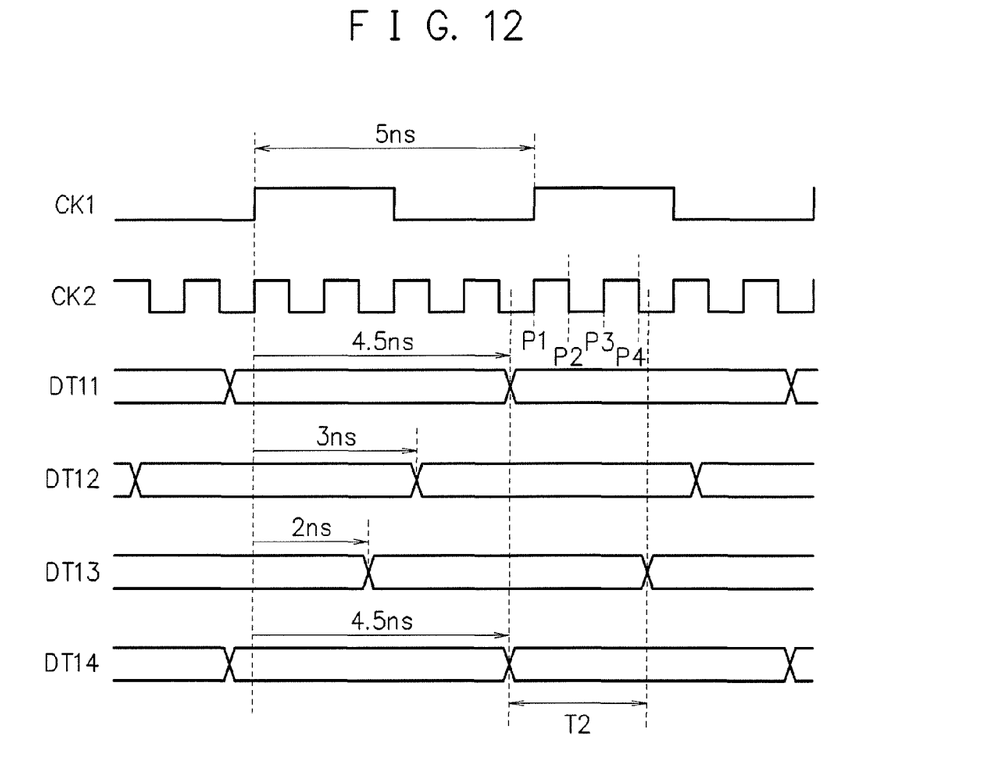
FIG. 12 is a timing chart illustrating an operation example of the skew reduction circuit in a case where the pattern of a second round is selected.

FIG. 12 is a timing chart illustrating an operation example of a skew reduction circuit in a case where the pattern of the second round is selected. A cycle of a clock signal CK1 is 5 [ns]. A total delay time of the data signal DT11 is 4.5 [ns]. A total delay time of the data signal DT12 is 3 [ns]. A total delay time of the data signal DT13 is 2 [ns]. A total delay time of the data signal DT14 is 4.5 [ns]. The largest mutual delay time difference of the data signals DT11 to DT14 is 4.5−2=2.5 [ns]. The data valid period T2 is 5−2.5=2.5 [ns], which is 50% of the cycle (5 [ns]) of the clock signal CK1, and satisfies the standard condition. Skews can be reduced similarly to in the case of FIG. 6B.

Further, in a step S1006 of FIG. 10, the core 114, as shown in FIG. 12, selects a falling edge phase P2 near a center among edge phases P1, P2, P3, P4 of the clock signal CK2 within the data valid period T2 of the pattern which has been set.

Note that the third swap circuit 103 also selects a swap pattern, similarly to in the above-described processing, to reduce skews most. In such a case, the swap control circuit 116 controls a third control signal CT3 by control of the core 114.

Next, in a step S1007, the skew reduction circuit starts actual transmission of the data signals DT1 to DT4 from the transmission circuit 121 to the reception circuit 123 in a state of the above-described set swap circuits 101 to 103. On this occasion, the core 114 acquires sampling data of the falling edge phase P2 of the clock signal CK2 selected above as reception data, and discards the other sampling data.

As described above, a first signal line is a plurality of signal lines which transmits the first signals DT1 to DT4 delayed by a plurality of first paths, respectively. A second signal line is a plurality of signal lines which transmit the plurality of second signals DT11 to DT14 delayed by a plurality of second paths, respectively. A third signal line is an input signal line of the second swap circuit 102, and is a plurality of signal lines which transmits the plural second signals DT11 to DT14 or signals corresponding thereto.

The first swap circuit 101 swaps and connects a part or all of the plural first signal lines to the plural second signal lines, in correspondence with the first control signal CT1. More specifically, the first swap circuit 101 swaps and connects the plural first signal lines to the plural second signal lines when a mutual delay time difference of the plural second signals DT11 to DT14 at a time that the plural first signal lines are swapped and connected to the plural second signal lines is smaller than a mutual delay time difference of the plural second signals DT11 to DT14 at a time that the plural first signal lines connected to the plural second signal lines without being swapped.

The second swap circuit 102 swaps and connects a part or all of the plural third signal lines to a plurality of fourth signal lines, in correspondence with the second control signal CT2. More specifically, the second swap circuit 102 swaps the plural third signal lines and connects to the plural fourth signal lines to return swap by the first swap circuit 101 to the original.

The third swap circuit 103 swaps and connects a part or all of a plurality of clock signal branch lines to a plurality of clock signal lines, in correspondence with the third control signal CT3. A swapping method of the third swap circuit 103 is similar to that of the first swap circuit 101.

The control circuits 110 to 115 detects mutual delay time differences of the plural second data signals DT11 to DT14 in a state where the first swap circuit 101 does not swap and mutual delay time differences of the plural second data signals DT11 to DT14 in a state where the first swap circuit 101 swaps, and controls swap of the first swap circuit to bring about a state of the smallest mutual delay time difference among the plurality of mutual delay time differences having been detected.

In FIG. 1 and FIG. 8A, in the flip-flop circuits 104 to 107, a plurality of input terminals is connected to the plural second signal lines and a plurality of output terminals is connected to the plural third signal lines, between the first swap circuit 101 and the second swap circuit 102.

In FIG. 8B, in the flip-flop circuits 104 to 107, a plurality of input terminals is connected to the plural fourth signal lines, in a subsequent stage of the second swap circuit 102.

According to the present embodiment, by providing the swap circuits 101 to 103, the mutual delay time differences of the data signals and the clock signals can be made small. Further, compared with a case where skews are reduced by using a delay circuit, a circuit size and a power consumption can be reduced.

A mutual delay time difference of a plurality of signals can be made small.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit for skew reduction, comprising:
    a plurality of first signal lines configured to transmit a plurality of first signals delayed by a plurality of first paths respectively;
    a plurality of second signal lines configured to transmit a plurality of second signals delayed by a plurality of second paths respectively; and
    a first swap circuit configured to swap and connect at least one of the plurality of first signal lines to at least one of the plurality of second signal lines in correspondence with a first control signal,
    wherein the first swap circuit is configured to swap and connect the at least one of the plurality of first signal lines to the at least one of the plurality of second signal lines, when a mutual delay time difference of the plurality of second signals in a state where the at least one of the plurality of first signal lines is swapped and connected to the at least one of the plurality of second signal lines is smaller than a mutual delay time difference of the plurality of second signals in a state where the plurality of first signal lines is connected to the plurality of second signal lines without being swapped.

2. The circuit of claim 1,
    wherein the plurality of the first signals and the plurality of the second signals are data signals,
    the circuit comprising:
    a plurality of third signal lines configured to transmit the plurality of the second signals or a plurality of signals corresponding to the plurality of the second signals;
    a plurality of fourth signal lines; and
    a second swap circuit configured to swap and connect at least one of the plurality of third signal lines to at least one of the plurality of fourth signal lines in correspondence with a second control signal,
    wherein the second swap circuit is configured to swap and connect the at least one of the plurality of third signal lines to the at least one of the plurality of fourth signal lines to cancel the swap by the first swap circuit.

3. The circuit of claim 1, comprising
a control circuit configured to detect a plurality of mutual delay time differences including a mutual delay time difference of the plurality of second signals in a state where the first swap circuit does not swap and a mutual delay time difference of the plurality of second signals in a state where the first swap circuit swaps, and to control swap of the first swap circuit so that a state of the smallest mutual delay time difference among the plurality of mutual delay time differences is obtained.

4. The circuit of claim 2, comprising
a plurality of flip-flop circuits provided between the first swap circuit and the second swap circuit, a plurality of input terminals of the plurality of flip-flop circuits being connected to the plurality of second signal lines, a plurality of output terminals of the plurality of flip-flop circuits being connected to the plurality of third signal lines.

5. The circuit of claim 2, comprising
a plurality of flip-flop circuits provided in a subsequent stage of the second swap circuit, a plurality of input terminals of the plurality of flip-flop circuits being connected to the plurality of fourth signal lines.

6. The circuit of claim 1,
wherein the plurality of first signals and the plurality of second signals are clock signals,
the circuit comprising
a plurality of flip-flop circuits provided in a subsequent stage of the first swap circuit, a plurality of clock terminals of the plurality of flip-flop circuits being connected to the plurality of second signal lines.

* * * * *